United States Patent
Brox et al.

(10) Patent No.: US 11,621,033 B2
(45) Date of Patent: Apr. 4, 2023

(54) TECHNIQUES FOR LOW POWER OPERATION

(71) Applicant: Micron Technology, Inc., Boise, ID (US)

(72) Inventors: Martin Brox, Munich (DE); Thomas Hein, Munich (DE); Stefan Dietrich, Türkenfeld (DE); Natalija Jovanovic, Munich (DE); Ronny Schneider, Höhenkirchen-Siegertsbrunn (DE); Michael Dieter Richter, Ottobrunn (DE)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 17/145,066

(22) Filed: Jan. 8, 2021

(65) Prior Publication Data

US 2021/0217458 A1    Jul. 15, 2021

Related U.S. Application Data

(60) Provisional application No. 62/961,092, filed on Jan. 14, 2020.

(51) Int. Cl.
*G11C 11/4076* (2006.01)
*H01L 27/00* (2006.01)
(Continued)

(52) U.S. Cl.
CPC ...... *G11C 11/4076* (2013.01); *H04L 27/0008* (2013.01); *G11C 7/10* (2013.01); *G11C 7/1057* (2013.01); *G11C 11/4093* (2013.01)

(58) Field of Classification Search
CPC .......... G11C 11/4076; G11C 11/4093; G11C 7/10; G11C 7/1057; H04L 27/0008
(Continued)

(56) References Cited

U.S. PATENT DOCUMENTS

2011/0216586 A1   9/2011   Graef et al.
2015/0146766 A1   5/2015   Longo et al.
(Continued)

FOREIGN PATENT DOCUMENTS

CN   1738373 A   *   2/2006
CN   101510791 A   *   8/2009
(Continued)

OTHER PUBLICATIONS

ISA/KR, International Search Report and Written Opinion of the International Searching Authority, Int'l Appl. No. PCT/US2021/012962, dated Apr. 28, 2021, Korean Intellectual Property Office, Seo-gu, Daejeon, Republic of Korea, 13 pgs.

*Primary Examiner* — Ly D Pham
(74) *Attorney, Agent, or Firm* — Holland & Hart, LLP

(57) ABSTRACT

Methods, systems, and devices for techniques for low power operation are described. A device may be configurable to operate in a first mode and a second mode, where the first mode may include transmitting using a first modulation scheme having two logic levels and the second mode may include transmitting using a second modulation scheme having three or more (e.g., four) logic levels. The device may identify a data symbol for transmission and select, from the first mode and the second mode, the first modulation scheme for the transmission. In some example, the device may determine which of the two modes to select based on a value stored at a mode register. Here, the value stored by the mode register may indicate to utilize the first modulation scheme associated with the first mode. Thus, the device may transmit the data symbol by a signal modulated by the first modulation scheme.

22 Claims, 7 Drawing Sheets

(51) Int. Cl.
*H04L 27/00* (2006.01)
*G11C 7/10* (2006.01)
*G11C 11/4093* (2006.01)

(58) Field of Classification Search
USPC .......................................................... 365/149
See application file for complete search history.

(56) References Cited

U.S. PATENT DOCUMENTS

| | | | |
|---|---|---|---|
| 2018/0368111 A1* | 12/2018 | Yamada | ............... H04B 7/0452 |
| 2019/0102298 A1 | 4/2019 | Hasbun et al. | |
| 2019/0103143 A1 | 4/2019 | Hasbun et al. | |
| 2019/0287583 A1 | 9/2019 | Hollis | |

FOREIGN PATENT DOCUMENTS

| | | | | |
|---|---|---|---|---|
| CN | 101582757 B | * | 7/2014 | ........... H04L 1/0068 |
| JP | 2005070960 A | | 3/2005 | |
| TW | 200947941 A | * | 11/2009 | ........... H04L 1/0068 |

* cited by examiner

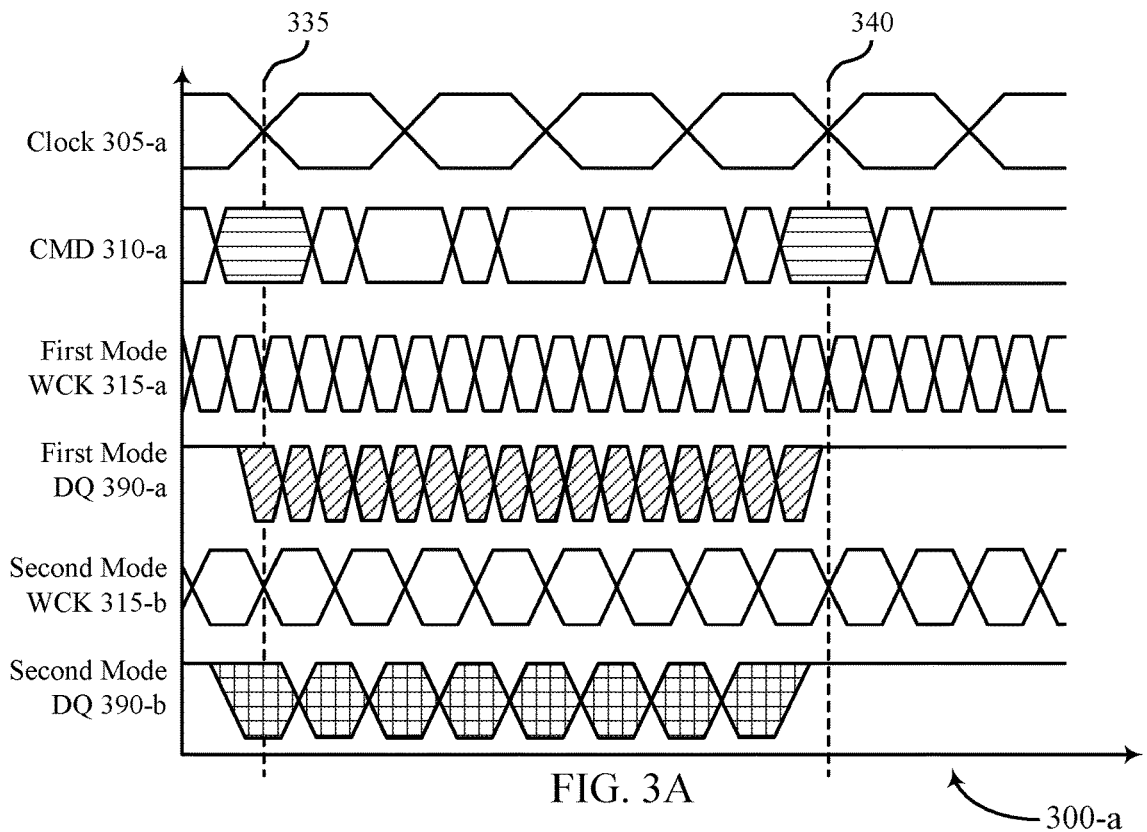
FIG. 3A
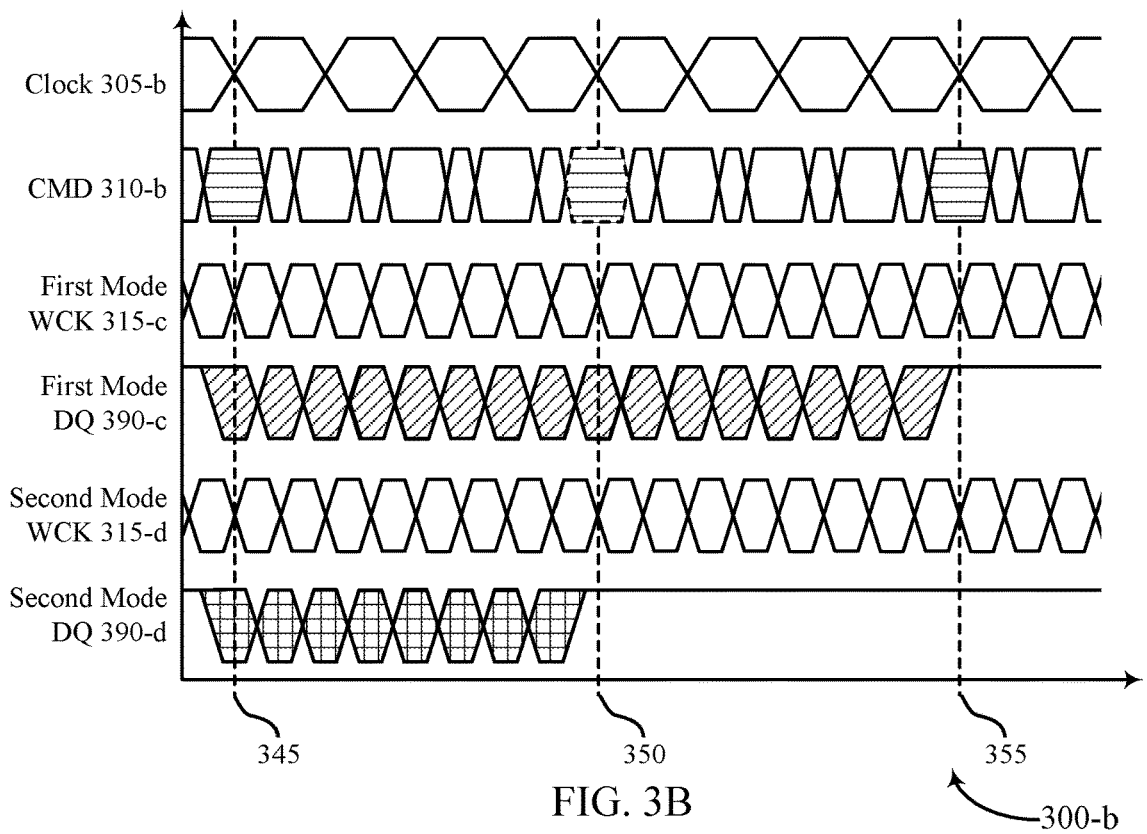
FIG. 3B
 Two-bit Symbol   One-bit Symbol   Read Command

TECHNIQUES FOR LOW POWER OPERATION

CROSS REFERENCE

The present application for patent claims the benefit of U.S. Provisional Patent Application No. 62/961,092, by BROX et al., entitled "TECHNIQUES FOR LOW POWER OPERATION," filed Jan. 14, 2020, assigned to the assignee hereof, and expressly incorporated by reference herein.

BACKGROUND

The following relates generally to one or more memory systems and more specifically to techniques for low power operation.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Improving memory devices, generally, may include increasing memory cell density, increasing read/write speeds, increasing reliability, increasing data retention, reducing power consumption, or reducing manufacturing costs, among other metrics.

BRIEF DESCRIPTION OF THE DRAWINGS

FIGS. 3A and 3B illustrate an example of timing diagrams that support techniques for low power operation in accordance with examples as disclosed herein.

DETAILED DESCRIPTION

A memory device may transmit or receive a signal that includes more than two physical levels (e.g., four physical levels). Such a signal may be modulated using a modulation scheme (e.g., a pulse amplitude modulation (PAM) scheme) that relates each of the physical levels to a logic level that may represent more than one bit of data (e.g., two bits of data). The signal may be transmitted or received, for example, via a channel in communication with a host device or in communication with one or more components of the memory device. Although modulation schemes associated with more than two logic levels may be associated with a faster data rate, modulation schemes associated with more than two logic levels may also consume more power than modulation schemes that modulate a signal with two logic levels (e.g., a graphics double data rate (GDDR) scheme). Thus, a memory device configured to modulate a signal with more than two logic levels may also be configured to modulate a signal according to a modulation scheme associated with two levels, thus consuming less power, among other advantages.

The memory device may be configured to select a modulation scheme from a first and second modulation schemes to transmit a signal based on this selection. The first modulation scheme may have two logic levels and may be associated with a lower power consumption than the second modulation scheme having four logic levels. The memory device may be configurable to operate in either a first mode associated with the first modulation scheme or a second mode associated with the second modulation scheme, and select one of the two modes of operation. For example, the memory device may select the first mode of operation based on one or more aspects and transmit a signal via a signal modulated by the first modulation scheme. In another example, the memory device may select the second mode of operation based on one or more aspects and transmit a signal via a signal modulated by the second modulation scheme. Thus, the memory device may be configured to select and operate in the first mode of operation with the first modulation scheme (e.g., associated with a lower power consumption) to conserve power. Additionally, the memory device may be configured to select and operate in the second mode of operation with the second modulation scheme to increase a speed of data transfer to, from, or within the memory device.

Features of the disclosure are initially described in the context of memory systems and dies as described with reference to FIGS. 1 and 2. Features of the disclosure are described in the context of a timing diagram and a system as described with reference to FIGS. 3 and 4. These and other features of the disclosure are further illustrated by and described with reference to an apparatus diagram and flowcharts that relate to techniques for low power operation as described with references to FIGS. 4-7.

Figure 1:
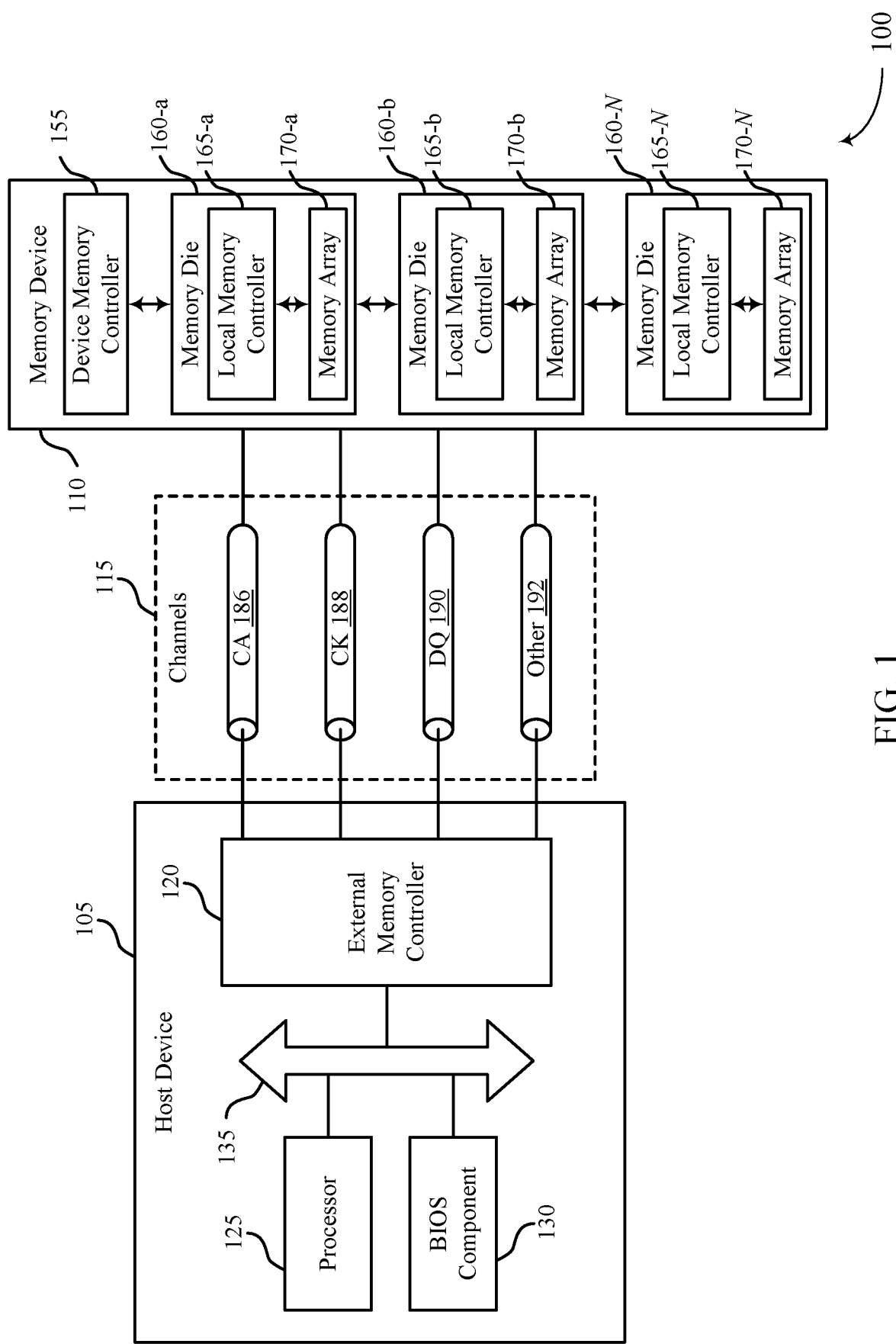
FIG. 1 illustrates an example of a system that supports techniques for low power operation in accordance with examples as disclosed herein.

FIG. 1 illustrates an example of a system 100 that supports techniques for low power operation in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal). At least some of the channels 115 may be operable to communicate data modulated according to two different modulation schemes. For example, the channels 115 may be configured to communicate data modulated according to a first modulation scheme with two levels. Additionally, the channels 115 may be configured to communicate data modulated according to a second modulation scheme with more than two levels (e.g., four levels).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, DQ channels 190 may be operable to communicate one or more of data or control information between the host device 105 and the memory device 110. For example, the DQ channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some cases, the modulation schemes of the various signals may be amplitude modulation schemes that encode information in the amplitude (or level) of a signal (e.g., a voltage amplitude or a current amplitude). The symbols of the modulation schemes may be referred to as levels, amplitudes, or signal strengths. For example, a first level of a signal modulated by a binary modulation scheme may represent '0' and a second level of a signal modulated by a non-binary modulation scheme may represent '1'. In an example of a non-binary modulation scheme, a first level of a signal may represent '00', a second level may represent '01', a third level may represent '10', and a fourth level may represent '11'. In some cases, a single symbol of the amplitude modulation scheme may be a constant level applied during a single symbol duration or two or more levels applied during a single symbol duration.

A non-binary modulation scheme may allow the memory device 110 to achieve target communication or operation metrics. That is, a non-binary modulation scheme may provide more bandwidth than a binary modulation scheme with a smaller quantity of levels. But communicating a signal using a non-binary modulation scheme may consume more power than communicating a signal using a binary modulation scheme. For example, the memory device 110 may modulate a signal by applying voltages to various transistors within a driving circuit. A non-binary modulation scheme may generate intermediate levels (e.g., a voltage level in between a maximum and minimum voltage level) by driving an n-type metal-oxide-semiconductor (NMOS) transistor against a p-type metal-oxide-semiconductor (PMOS) transistor which may result in current through the transistors. That is driving a data line or bus to an intermediate level for a non-binary modulation scheme may result in significant power consumption when compared to a binary modulation scheme where neither level is associated with an active current through transistors.

The memory device 110 may be configured to selectively operate in either a first mode using a binary modulation scheme (e.g., a first modulation scheme) or a second mode using a non-binary modulation scheme (e.g., a second modulation scheme) to minimize power consumption or latency, respectively. Thus, the modulation scheme used to communicate signals over the channels 115 may be based on a mode of operation of the memory device 110. For example, when operating in the first mode, the signals communicated over the channels 115 may be modulated using a binary-level modulation scheme (e.g., a first modulation scheme) having two levels. Additionally, when operating in the second mode, the signals communicated over the channels 115 may be modulated using the second modulation scheme having three or more (e.g., four levels).

Figure 2:
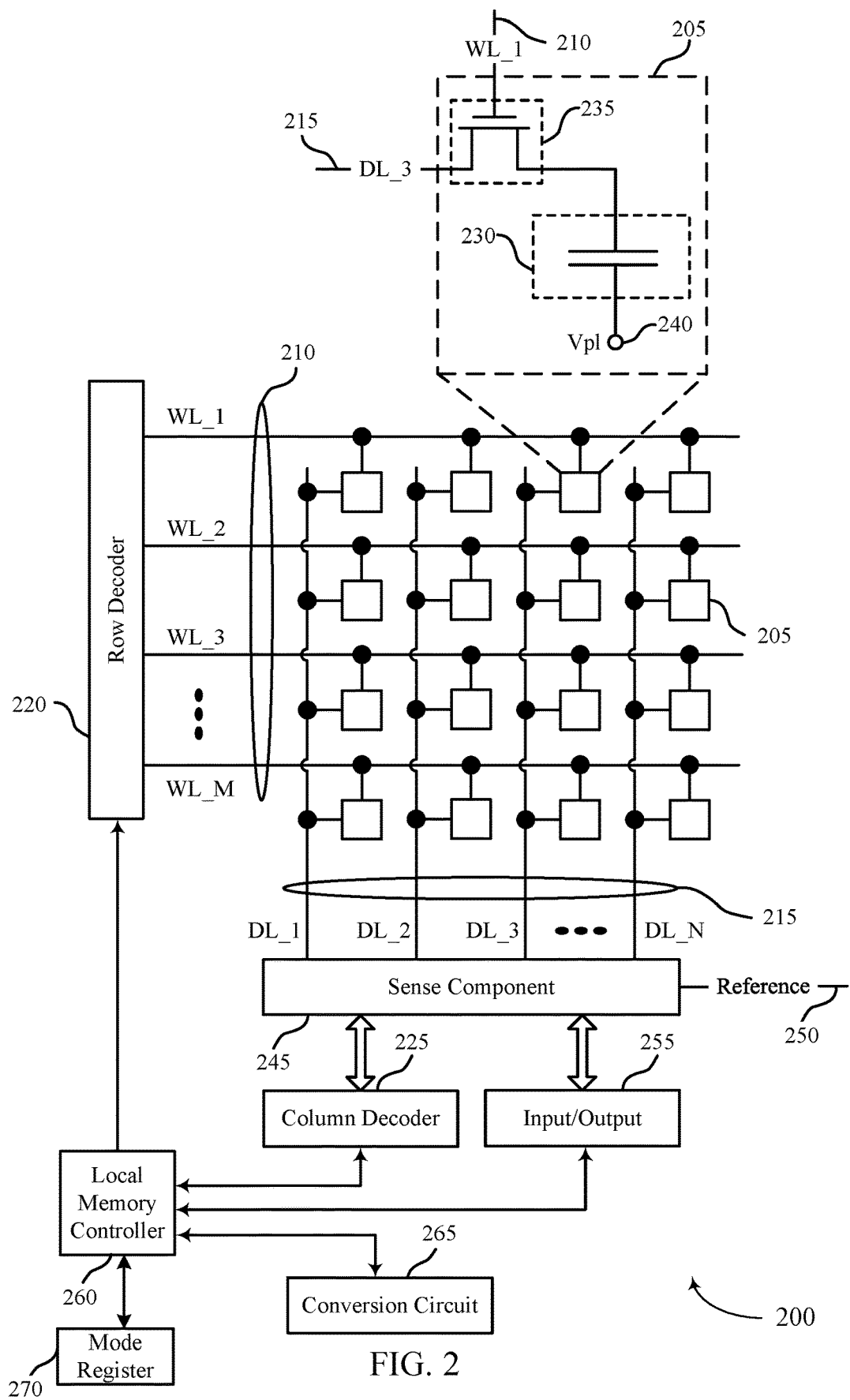
FIG. 2 illustrates an example of a memory die that supports techniques for low power operation in accordance with examples as disclosed herein.

FIG. 2 illustrates an example of a memory die 200 that supports techniques for low power operation in accordance with examples as disclosed herein. The memory die 200 may be an example of the memory dies 160 de with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

The local memory controller 260 may be coupled with a conversion circuit 265, which may be configured to convert signals between different types, such as between serial signals and parallel signals. For example, the local memory controller 260 may communicate a parallel signal (e.g., including data read from one or more memory cells 205) to the conversion circuit 265 and the conversion circuit 265 may convert the signal to a serial signal. In some cases, the conversion circuit 265 may output the serial signal on a bus associated with the memory device (e.g., an internal bus, a DQ channel). Additionally, the local memory controller 260 may select a modulation scheme for the signals output by the conversion circuit 265. The local memory controller 260 may read a stored value (e.g., a value stored in the mode register 270) to determine whether one or more components associated with the memory die are to operate according to a first mode associated with a binary modulation scheme (e.g., a first modulation scheme) or a second mode associated with a non-binary modulation scheme (e.g., a second modulation scheme). Based on the value (e.g., the value stored by the mode register 270), the memory device may select either the first mode or the second mode, and configure the conversion circuit 265 to modulate a signal according to the modulation scheme associated with the selected mode.

FIGS. 3A and 3B illustrate examples of timing diagrams 300-a and 300-b respectively that support techniques for low power operation in accordance with examples as disclosed herein. The signals illustrated by timing diagrams 300-a and 300-b may be examples of signals communicated by components or systems as described with reference to FIGS. 1 and 2. For example, the clock signals 305 may be examples of signals communicated by the CK channel as described with reference to FIG. 1, the command (CMD) signals 310 may be examples of signals communicated by the CA channel as described with reference to FIG. 1, the DQ signals 390 may be examples of signals communicated by the DQ channel as described with reference to FIG. 1; and the write clock (WCK) signal 325 may be an example of a signal communicated by a CK channel or a bus internal to a memory die as described with reference to FIGS. 1 and 2.

Each of the timing diagrams 300-a and 300-b may illustrate examples of a DQ signal 390 being modulated according to a first modulation scheme (e.g., a first mode DQ signals 390-a, 390-c) and a DQ signal 390 being modulated according to a second modulation scheme (e.g., a second mode DQ signals 390-b, 390-d). For each of the timing diagrams 300-a and 300-b, a memory controller associated with the memory device may select, based on a value stored for example within a mode register, to operate in either the first mode or the second mode. Accordingly, the local memory controller may generate a WCK signal 315 and a DQ signal 390 according to the selected mode. FIG. 3A illustrates an example of the two modes (and corresponding modulation schemes) where a data rate associated with each of the two modes is the same, and FIG. 3B illustrates an example of the two mode where a WCK signal 315 rate associated with each of the two modes is the same.

The mode register may be programmed dynamically by the memory device or the host device to store a first value indicating the first mode of operation or a second value indicating the second mode of operation. That is, the memory device or the host device may program the mode register based on an operating condition being met, a trigger occurring, or some other factor (e.g., a predefined factor) associated with an operation of the memory device. The mode register may be programmed by the memory device. For example, the memory device may determine a mode to operate in and set the mode register to a value indicating the determined mode. For example, the memory device may be disconnected from a power source. The memory device may set the mode register to a value indicating the first mode of operation (e.g., associated with the binary modulation scheme that consumes less power). In another example, a trigger event may cause the memory device to program the mode register to a certain value. For example, if a rate of receiving commands from a host device exceeds a threshold, the memory device may program the mode register to indicate the second mode of operation. Additionally or alternatively, the mode register may be programmed by a host device. For example, the host device may utilize the memory device to perform an operation with a latency requirement. Here, the host device may program the mode register to store a value indicating the second mode of operation (e.g., associated with the non-binary modulation scheme that has lower latency).

The memory device may read the mode register (e.g., to determine the mode of operation of the memory device) according to a certain periodicity. Additionally or alternatively, the memory device may read the mode register based on a receiving an indication from a host device or another component of the memory device (e.g., a memory controller). Thus, the memory device may detect if the mode register switches from storing a first value to storing a second value, indicating a switch from one mode of operation to another.

FIG. 3A illustrates a timing diagram 300-a. The clock signal 305-a may be an internally-generated clock signal (e.g., generated by one or more components within the memory device) or an externally-received clock signal (e.g., by a CK channel as described with reference to FIG. 1). The CMD signal 310-a may be an example of a CMD signal 310-a received by a CA channel as described with reference to FIG. 1. Here, the CMD signal 310 may indicate a read command at time 335. The memory device may execute the read command and read data from a memory array within the memory device according to the read command, for example, received at time 335. The memory device may transmit the data indicated by the read command by the DQ channel (e.g., to a host device). Here, each of the DQ signals 390 may illustrate, as some examples, a transmission of 16 bits by the DQ channel, although more or fewer bits could be transmitted by the DQ channel.

The memory device may be configured to operate in one of multiple different modes corresponding to different modulation schemes. In some examples, the first modulation scheme may be associated with a lower power consumption than the second modulation scheme while the second modulation scheme may be associated with a faster data transmission speed. The memory device may dynamically select one of the two operating modes based on a stored value (e.g., a value within a mode register) of the memory device. For example, the memory device may read the mode register and determine to operate in the first mode (e.g., corresponding to a first binary modulation scheme) based on one or more values stored in the mode register. After some time, the memory device may determine that a value stored in the mode register has been changed to indicate the second mode. Thus, the memory device may switch to the second mode of operation (e.g., corresponding to a second non-binary modulation scheme). The mode register may be programmed, in some example, by a host device or another component and may indicate either the first mode or the second mode based on a value stored in the mode register. The mode of operation of the memory device may, in some examples, be updated from one mode to another mode (or some mode back to an earlier mode) based on a desired performance of the memory device. For example, in a lower power operation, the host device may update the mode register to indicate the first mode of operation. Additionally, in lower latency operation, the host device may update the mode register to indicate the second mode of operation.

Some examples in line with the present disclosure are described. If the memory device is operating in the first mode and according to a binary modulation scheme (e.g., the first modulation scheme), the memory device may generate the first mode WCK signal 315-a and the first mode DQ signal 390-a. The first mode DQ signal 390-a may be transmitted according to the first modulation scheme. Thus, each symbol of the first mode DQ signal 390-a may represent a single bit of information (e.g., a logic bit '0' or a logic bit '1'). The burst length of the first mode DQ signal 390-a may be equivalent to sixteen first mode WCK signal 315-a cycles and last from time 335 to time 340.

If the memory device is operating in the second mode and according to a non-binary modulation scheme (e.g., the second modulation scheme), the memory device may generate the second mode WCK signal 315-b and the second mode DQ signal 390-b. The second mode DQ signal 390-b may be transmitted according to the second modulation scheme. Thus, each symbol of the second mode DQ signal 390-b may represent two bits of information (e.g., logic bits '00', '01', '10', or '11'). The burst length of the second mode DQ signal 390-b may be equivalent to eight second mode WCK signal 315-b cycles and last from time 335 to time 340.

The first mode WCK signal 315-a may be toggled at a faster speed than the second WCK signal 315-b to increase a symbol rate of the first mode DQ signal 390-a. Thus, although each symbol within the first mode DQ signal 390-a represents fewer bits of information, the data rate (e.g., the quantity of bits communicated within the time period between time 335 and time 340) of the first mode DQ signal 390-a and the second mode DQ signal 390-b are the same. For example, the first mode WCK signal 315-a may be four times faster than the clock signal 305-a while the second WCK signal 315-b may be two times faster than the clock signal 305-a. As a result, the symbol rate of the first mode DQ signal 390-a may be eight symbols (e.g., within a full cycle of the clock signal 305-a) while the symbol rate of the second mode DQ signal 390-b may be four symbols. Because the symbol rate of the first mode DQ signal 390-a is twice the symbol rate of the second mode DQ signal 390-b, the data rate (e.g., a rate of bit transmission) of each of the DQ signals 390 is the same —eight bits of data within each full cycle of the clock signal 305-a. Thus, the memory device may dynamically switch modulation schemes (e.g., to strategically minimize power consumption) and maintain a same data rate.

FIG. 3B illustrates a timing diagram 300-b. The clock signal 305-b and the CMD signal 310-b may be similar to the clock signal and CMD signal as described with reference to FIG. 3A. Here, each WCK signal 315 may be the same when the memory device is operating in either the first mode (e.g., using the first modulation scheme) or the second mode (e.g., using the second modulation scheme). As a result, a symbol rate of the data transmissions (e.g., by the DQ signals 390) may be the same across different modes, but the data rate of the first mode may be lower than the data rate of the second mode. The CMD signal 310-b may indicate a read command at time 345. The memory device may execute the read command and read data from a memory array within the memory device according to the read command received at time 345. The memory device may transmit the data indicated by the read command by the DQ channel (e.g., to a host device). Here, each of the DQ signals 390 may illustrate a transmission of 16 bits by the DQ channel, although more or less bits could be transmitted by the DQ channel.

Some examples in line with the present disclosure are described. If the memory device is operating in the first mode and according to a binary modulation scheme (e.g., the first modulation scheme), the memory device may generate the first mode WCK signal 315-c and the first mode DQ signal 390-c. The first mode DQ signal 390-c may be transmitted according to the first modulation scheme. Thus, each symbol of the first mode DQ signal 390-c may represent a single bit of information (e.g., a logic bit '0' or a logic bit '1'). The burst length of the first mode DQ signal 390-c may be equivalent to sixteen first mode WCK signal 315-c cycles and last from time 345 to time 355 (e.g., equivalent to four full cycles of the clock signal 305-b). When the memory device is operating in the first mode, the memory device may be operable to execute a second read command after four full cycles of the clock signal 305-b at time 355.

If the memory device is operating in the second mode and according to a non-binary modulation scheme (e.g., the second modulation scheme), the memory device may generate the second mode WCK signal 315-d (e.g., the same as the first mode WCK signal 315-c) and the second mode DQ signal 390-d. The second mode DQ signal 390-d may be transmitted according to the second modulation scheme. Thus, each symbol of the second mode DQ signal 390-d may represent two bits of information (e.g., logic bits '00', '01', '10', or '11'). The burst length of the second mode DQ signal 390-d may be equivalent to eight second mode WCK signal 315-d cycles and last from time 345 to time 350 (e.g., equivalent to two full cycles of the clock signal 305-b). When the memory device is operating in the second mode, the memory device may be operable to execute a second read command after the two full cycles of the clock signal 305-b at time 350.

The first mode WCK signal 315-c may be toggled at a same rate as the second WCK signal 315-d, which may cause the symbol rate of the first mode DQ signal 390-c and the second mode DQ signal 390-d to be the same. Thus, the data rate (e.g., the quantity of bits communicated within the time period between time 335 and time 340) of the first mode DQ signal 390-c is less than the data rate of the second mode DQ signal 390-d. For example, the first mode DQ signal 390-c may communicate eight bits within a full cycle of the clock signal 305-b while the second mode DQ signal 390-c may communicate sixteen within the full cycle of the clock signal 305-b. Thus, the memory device may dynamically switch modulation schemes (e.g., to strategically minimize power consumption) and maintain a same symbol rate.

Figure 4:
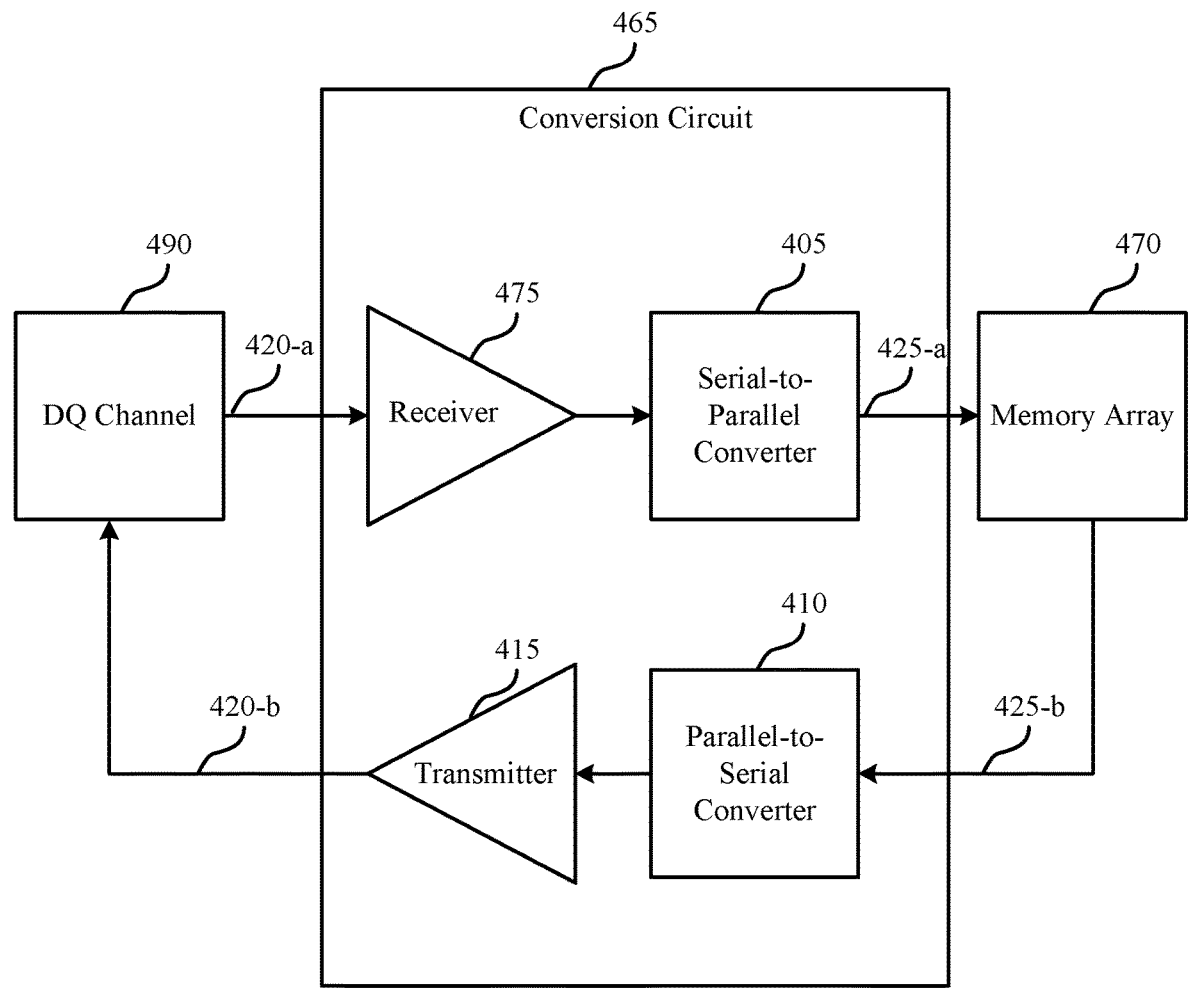
FIG. 4 illustrates an example of a system that supports techniques for low power operation in accordance with examples as disclosed herein.

FIG. 4 illustrates an example of a system 400 that supports techniques for low power operation in accordance with examples as disclosed herein. The system 400 may include one or more components described herein with reference to FIGS. 1 through 3. For example, the system 400 may include a memory array 470, which may be an example of a memory array 170 as described with reference to FIG. 1; DQ channel 490, which may be an example of a DQ channel 190 as described with reference to FIG. 1; a conversion circuit 465, which may be an example of a conversion circuit 465 as described with reference to FIG. 1. Additionally, the signals 420 and 425 may include aspects of signals (and signal modulation techniques) described with reference to FIGS. 3A and 3B.

The memory array 470 may be coupled with the conversion circuit 465 (e.g., by a local memory controller as described with reference to FIG. 1). The conversion circuit 465 may in turn be coupled with the DQ channel 490. The conversion circuit 465 may be configured to convert between different types of signals, parallel signals and serial signals. In a first example, the DQ channel 490 may communicate a serial signal 420-a to the receiver 475. The receiver 475 may communicate the serial signal 420-a to the serial-to-parallel converter 405. The serial-to-parallel converter 405 may convert the serial signal 420-a to a parallel signal 425-a and transmit the parallel signal 425-a to the memory array 470 (e.g., to be stored at the memory array 470). In another example, the memory array 470 may communicate data by a parallel signal to the conversion circuit 465. The parallel-to-serial converter 410 may convert the parallel signal to a serial signal and communicate the signal to the transmitter 415. The transmitter 415 may be configured to transmit the serial signal to the DQ channel 490 (e.g., to be communicated to a host device).

Each of the serial signals 420 may be modulated according to a modulation scheme. For example, the conversion circuit 465 may receive an indication (e.g., from a memory controller) indicating either a first mode of operation (e.g., corresponding to a first binary modulation scheme) or a second mode of operation (e.g., corresponding to a second non-binary modulation scheme). The conversion circuit 465 may configure the receiver 475 and the transmitter 415 based on the indicated mode of operation.

In the first mode of operation, the receiver 475 may receive the serial signal 420-a modulated according to a binary modulation scheme. Additionally, the transmitter 415 may modulate the signal (e.g., received from the parallel-to-serial converter 410) using a binary modulation scheme to generate the serial signal 420-b. In the second mode of operation, the receiver 475 may receive the serial signal 420-a modulated according to a non-binary modulation scheme. Additionally, the transmitter 415 may modulate the signal received from the parallel-to-serial converter 410 using a non-binary modulation scheme to generate the serial signal 420-b.

The DQ channel 490 may transmit (e.g., the receiver 475) or receive (e.g., from the transmitter 415) serial signals 420 according to a first symbol rate and may transmit or receive parallel signals 425 according to a second symbol rate. For example, during a first mode of operation, the symbol rate of the serial signals 420 may be four or eight symbols every full clock cycle of the system 400 (e.g., as described with reference to FIGS. 3A and 3B) and the symbol rate of the parallel signals 425 may be half or a quarter of a symbol every full clock cycle, respectively. In another example, during the second mode of operation, the serial signals 420 may be modulated by a multi-level or non-binary modulation scheme. Here, the symbol rate of the serial signals 420 may be four symbols every full clock cycle and the symbol rate of the parallel signals 425 may be half a symbol every clock cycle.

Figure 5:
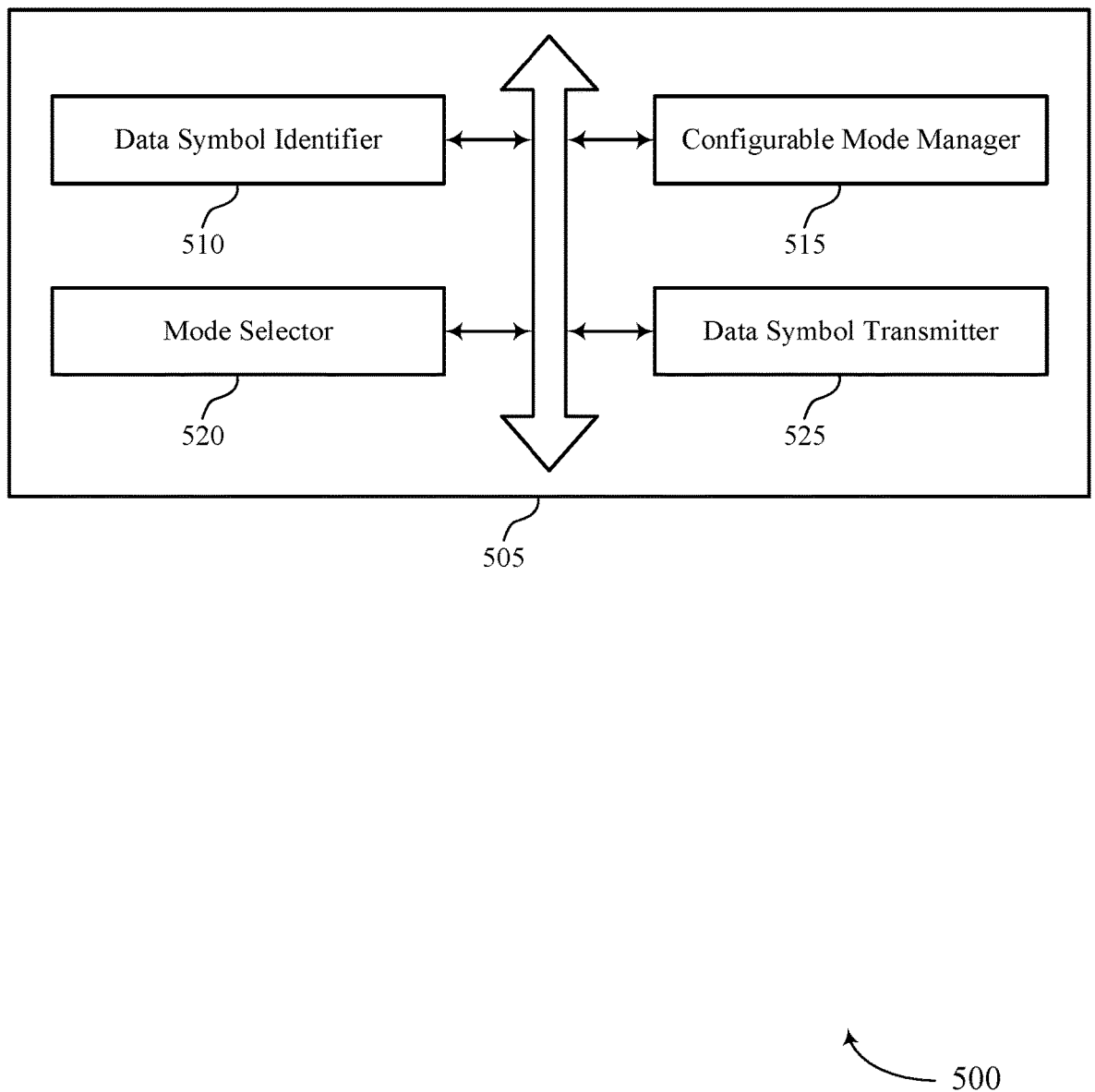
FIG. 5 shows a block diagram of a device that supports techniques for low power operation in accordance with examples as disclosed herein.

FIG. 5 shows a block diagram 500 of a device 505 that supports techniques for low power operation in accordance with examples as disclosed herein. The device 505 may be an example of aspects of memory device as described with reference to FIGS. 1-4. The device 505 may include a data symbol identifier 510, a configurable mode manager 515, a mode selector 520, and a data symbol transmitter 525. Each of these modules may communicate, directly or indirectly, with one another (e.g., via one or more buses).

The data symbol identifier 510 may identify, at a device, a data symbol including a first bit and a second bit for transmission. In some instances, the data symbol identifier 510 may identify a second data symbol including a first bit and a second bit for transmission.

The configurable mode manager 515 may determine that the device is configurable to operate in a first mode and a second mode, where the operating in the first mode includes transmitting using a first modulation scheme having two logic levels and operating in the second mode includes transmitting using a second modulation scheme having four logic levels. A value of the data symbol may correspond to one of the four logic levels of the second modulation scheme and a value of the first bit or the second bit may correspond to one of the two logic levels of the first modulation scheme. In some cases, the first modulation scheme is associated with a lower power consumption of the device than the second modulation scheme.

The mode selector 520 may select, from the first mode that includes transmitting using the first modulation scheme and the second mode that includes transmitting using the second modulation scheme, the first modulation scheme associated with the first mode for the transmission. In some examples, the mode selector 520 may determine that a mode register stores a first value indicating the first modulation scheme. Here, selecting the first modulation scheme may be based on the determining.

In some examples, the mode selector 520 may select, from the first mode that includes transmitting using the first modulation scheme and the second mode that includes transmitting using the second modulation scheme, the second modulation scheme for the transmission. In some cases, the mode selector 520 may determine that the mode register stores a second value indicating the second modulation scheme. Here, selecting the second modulation scheme may be based on the determining.

The data symbol transmitter 525 may transmit the data symbol via a signal modulated by the first modulation scheme based on selecting the first modulation scheme for the transmission. In some examples, the data symbol transmitter 525 may transmit the second data symbol via a second signal modulated by the second modulation scheme based on the selecting. In some cases, the signal is modulated over one clock cycle at a first rate and the second signal is modulated over one clock cycle at a second rate faster than the first rate. In some other cases, the signal is modulated over two clock cycles at a rate and the second signal is modulated over one clock cycle at the rate.

The data symbol transmitter 525 may transmit, across a transmission path between an array of memory cells and a bus, a first set of data symbols according to a first mode of operation of a memory device, the first mode of operation including transmitting using a first modulation scheme having two logic levels.

The mode selector 520 may change, based on a value stored in the memory device (e.g., by the mode register), from the first mode of operation of the memory device to a second mode of operation of the memory device including transmitting using a second modulation scheme having four logic levels. For example, the mode selector 520 may detect that the value stored in the memory device by a mode register changes from a first value corresponding to the first mode of operation of the memory device to a second value corresponding to the second mode of operation of the memory device, where determining the change is based on the detecting. In some cases, each level of the first modulation scheme associated with the first mode of operation is configured to represent one bit within a data symbol of the first set of data symbols. Additionally or alternatively, each level of the second modulation scheme associated with the second mode of operation may be configured to represent one data symbol of the second set of data symbols.

The data symbol transmitter 525 may transmit, across the transmission path between the array of memory cells and the bus, a second set of data symbols according to the second mode of operation of the memory device based on the changing. In some examples, transmitting using the first modulation scheme includes transmitting using a first modulation rate and transmitting using the second modulation scheme includes transmitting using a second modulation rate faster than the first modulation rate. In some other examples, transmitting using the first modulation scheme and transmitting using the second modulation scheme includes transmitting using a same modulation rate.

In some cases, transmitting across the transmission path between the array of memory cells and the bus includes transmitting using a circuit configured to convert a signal from a parallel signal to a serial signal. In some instances, transmit each data symbol within the first set of data symbols and the second set of data symbols includes transmitting more than one bit.

Figure 6:
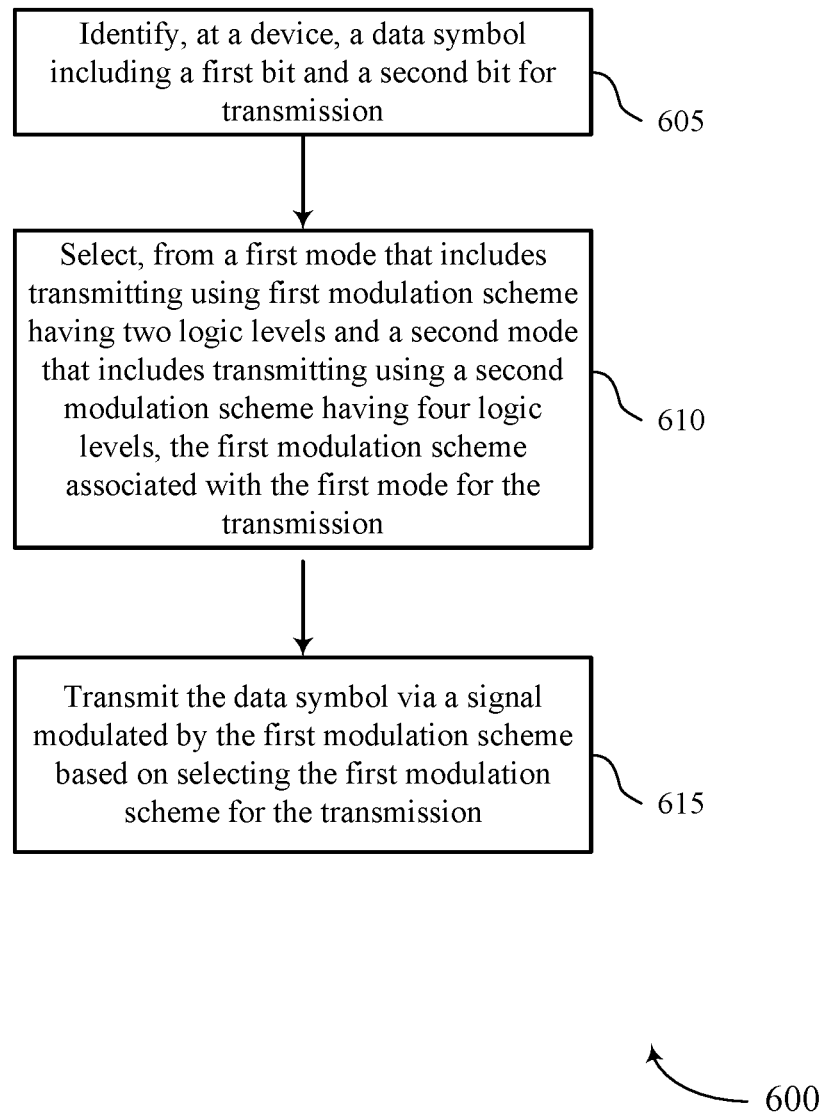
FIGS. 6 and 7 show flowcharts illustrating a method or methods that support techniques for low power operation in accordance with examples as disclosed herein.

FIG. 6 shows a flowchart illustrating a method or methods 600 that supports techniques for low power operation in accordance with examples as disclosed herein. The operations of method 600 may be implemented by a device (e.g., a memory device) or its components as described herein. For example, the operations of method 600 may be performed by a device as described with reference to FIG. 5. In some examples, a device may execute a set of instructions to control the functional elements of the device to perform the described functions. Additionally or alternatively, a device may perform aspects of the described functions using special-purpose hardware.

At 605, the device may identify a data symbol including a first bit and a second bit for transmission. The operations of 605 may be performed according to the methods described herein. In some examples, aspects of the operations of 605 may be performed by a data symbol identifier as described with reference to FIG. 5.

At 610, the device may select, from a first mode that includes transmitting using a first modulation scheme having two logic levels and a second mode that includes transmitting using the second modulation scheme having four logic levels, the first modulation scheme associated with the first mode for the transmission. The operations of 615 may be performed according to the methods described herein. In some examples, aspects of the operations of 615 may be performed by a mode selector as described with reference to FIG. 5.

At 615, the device may transmit the data symbol via a signal modulated by the first modulation scheme based on selecting the first modulation scheme for the transmission. The operations of 615 may be performed according to the methods described herein. In some examples, aspects of the operations of 620 may be performed by a data symbol transmitter as described with reference to FIG. 5.

In some examples, an apparatus as described herein may perform a method or methods, such as the method 600. The apparatus may include features, means, or instructions (e.g., a non-transitory computer-readable medium storing instructions executable by a processor) for identifying, at a device, a data symbol including a first bit and a second bit for transmission. The apparatus may include features, means, or instructions for selecting, from a first mode that includes transmitting using a first modulation scheme having two logic levels and the second mode that includes transmitting using a second modulation scheme having four logic levels, the first modulation scheme associated with the first mode for the transmission, and transmitting the data symbol via a signal modulated by the first modulation scheme based on selecting the first modulation scheme for the transmission.

Some examples of the method 600 and the apparatus described herein may further include operations, features, means, or instructions for determining that a mode register stores a first value indicating the first modulation scheme, where selecting the first modulation scheme may be based on the determining.

Some cases of the method 600 and the apparatus described herein may further include operations, features, means, or instructions for identifying a second data symbol including a first bit and a second bit for transmission, selecting, from the first mode that includes transmitting using the first modulation scheme and the second mode that includes transmitting using the second modulation scheme, the second modulation scheme for the transmission, and transmitting the second data symbol via a second signal modulated by the second modulation scheme based on the selecting.

Some instances of the method 600 and the apparatus described herein may further include operations, features, means, or instructions for determining that a mode register stores a second value indicating the second modulation scheme, where selecting the second modulation scheme may be based on the determining.

In some examples of the method 600 and the apparatus described herein, the signal may be modulated over one clock cycle at a first rate, and the second signal may be modulated over one clock cycle at a second rate faster than the first rate.

In some cases of the method 600 and the apparatus described herein, the signal may be modulated over two clock cycles at a rate, and the second signal may be modulated over one clock cycle at the rate.

In some instances of the method 600 and the apparatus described herein, a value of the data symbol corresponds to one of the four logic levels of the second modulation scheme.

In some examples of the method 600 and the apparatus described herein, a value of the first bit or the second bit corresponds to one of the two logic levels of the first modulation scheme.

In some cases of the method 600 and the apparatus described herein, the first modulation scheme may be associated with a lower power consumption of the device than the second modulation scheme.

Figure 7:
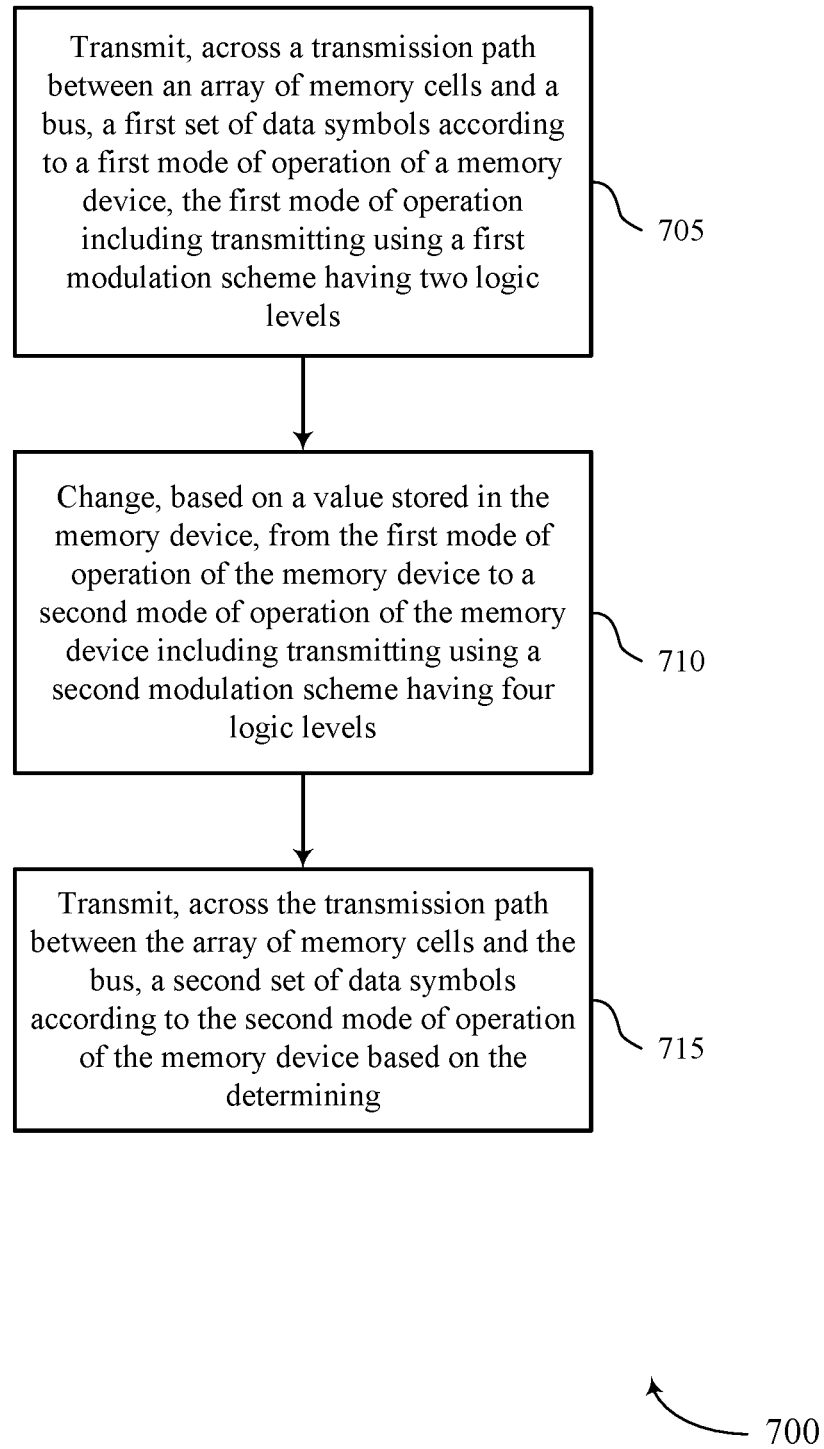

FIG. 7 shows a flowchart illustrating a method or methods 700 that supports techniques for low power operation in accordance with examples as disclosed herein. The operations of method 700 may be implemented by a device (e.g., a memory device) or its components as described herein. For example, the operations of method 700 may be performed by a device as described with reference to FIG. 5. In some examples, a device may execute a set of instructions to control the functional elements of the device to perform the described functions. Additionally or alternatively, a device may perform aspects of the described functions using special-purpose hardware.

At 705, the device may transmit, across a transmission path between an array of memory cells and a bus, a first set of data symbols according to a first mode of operation of a memory device, the first mode of operation including transmitting using a first modulation scheme having two logic levels. The operations of 705 may be performed according to the methods described herein. In some examples, aspects of the operations of 705 may be performed by a data symbol transmitter as described with reference to FIG. 5.

At 710, the device may determine, based on a value stored in the memory device, to change from the first mode of operation of the memory device to a second mode of operation of the memory device including transmitting using a second modulation scheme having four logic levels. The operations of 710 may be performed according to the methods described herein. In some examples, aspects of the operations of 710 may be performed by a mode selector as described with reference to FIG. 5.

At 715, the device may transmit, across the transmission path between the array of memory cells and the bus, a second set of data symbols according to the second mode of operation of the memory device based on the determining. The operations of 715 may be performed according to the methods described herein. In some examples, aspects of the operations of 715 may be performed by a data symbol transmitter as described with reference to FIG. 5.

In some examples, an apparatus as described herein may perform a method or methods, such as the method 700. The apparatus may include features, means, or instructions (e.g., a non-transitory computer-readable medium storing instructions executable by a processor) for transmitting, across a transmission path between an array of memory cells and a bus, a first set of data symbols according to a first mode of operation of a memory device, the first mode of operation including transmitting using a first modulation scheme having two logic levels and changing, based on a value stored in the memory device, from the first mode of operation of the memory device to a second mode of operation of the memory device including transmitting using a second modulation scheme having four logic levels. The apparatus may further include features, means, or instructions for transmitting, across the transmission path between the array of memory cells and the bus, a second set of data symbols according to the second mode of operation of the memory device based on the changing.

Some examples of the method 700 and the apparatus described herein may further include operations, features, means, or instructions for detecting that the value stored in the memory device by a mode register changes from a first value corresponding to the first mode of operation of the memory device to a second value corresponding to the second mode of operation of the memory device, where determining the change may be based on the detecting.

In some cases of the method 700 and the apparatus described herein, transmitting using the first modulation scheme may include operations, features, means, or instructions for transmitting using a first modulation rate, and transmitting using the second modulation scheme may include operations, features, means, or instructions for transmitting using a second modulation rate faster than the first modulation rate.

In some instances of the method 700 and the apparatus described herein, transmitting using the first modulation scheme and transmitting using the second modulation scheme may include operations, features, means, or instructions for transmitting using a same modulation rate.

In some examples of the method 700 and the apparatus described herein, transmitting across the transmission path between the array of memory cells and the bus may include operations, features, means, or instructions for transmitting using a circuit configured to convert a signal from a parallel signal to a serial signal.

In some cases of the method 700 and the apparatus described herein, transmitting each data symbol within the first set of data symbols and the second set of data symbols may include operations, features, means, or instructions for transmitting more than one bit.

In some instances of the method 700 and the apparatus described herein, each level of the first modulation scheme associated with the first mode of operation may be configured to represent one bit within a data symbol of the first set of data symbols.

In some examples of the method 700 and the apparatus described herein, each level of the second modulation scheme associated with the second mode of operation may be configured to represent one data symbol of the second set of data symbols.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells, a transmission path configured to couple the array of memory cells to a bus associated with the apparatus, a controller coupled with the transmission path and configured to select between a first modulation scheme having two logic levels for transmitting a signal and a second modulation scheme having four logic levels for transmitting the signal, and a mode register coupled with the controller. The mode register may be configured to store a value indicating that the apparatus is configured to transmit data symbols across the transmission path according to the first modulation scheme having the two logic levels or the second modulation scheme having the four logic levels.

In some examples, the apparatus may include a transmitter coupled with the transmission path and the controller and configured to transmit, via the transmission path, the signal modulated by a modulation scheme selected from the first modulation scheme and the second modulation scheme.

In some cases, the apparatus includes a circuit coupled with the transmission path and configured to convert a signal from a parallel signal to a serial signal.

In some instances, the apparatus includes a circuit coupled with the transmission path and configured to convert a signal from a serial signal to a parallel signal.

An apparatus is described. The apparatus may include a controller configured to identify a data symbol comprising a first bit and a second bit for transmission. The controller may be further configured to select, from the first mode that includes transmitting using a first modulation scheme having two logic levels and the second mode that includes transmitting using a second modulation scheme having four logic levels, the first modulation scheme associated with the first mode for the transmission. The apparatus may further include a transmitter coupled with the controller and configured to transmit the data symbol via a signal modulated by the first modulation scheme based on selecting the first modulation scheme for the transmission.

Some examples of the apparatus may include a mode register configured to store a first value indicating the first modulation scheme. Here, the controller may be configured to determine that the mode register stores the first value and select the first modulation scheme based on the determining.

In some cases, the controller may be further configured to identify second data symbol comprising a first bit and a second bit for transmission and select, from the first mode that comprises transmitting using the first modulation scheme and the second mode that comprises transmitting using the second modulation scheme, the second modulation scheme for the transmission. Here, the transmitter may be further configured to transmit the second data symbol via a second signal modulated by the second modulation scheme based at least in part on the selecting.

In some instances, the controller may be further configured to determine that a mode register stores a second value indicating the second modulation scheme, where selecting the second modulation scheme may be based on the determining.

In some examples, the signal may be modulated over one clock cycle at a first rate, and the second signal may be modulated over one clock cycle at a second rate faster than the first rate.

In some cases, the signal may be modulated over two clock cycles at a rate, and the second signal may be modulated over one clock cycle at the rate.

In some instances, a value of the data symbol corresponds to one of the four logic levels of the second modulation scheme.

In some examples, a value of the first bit or the second bit corresponds to one of the two logic levels of the first modulation scheme.

In some cases, the first modulation scheme may be associated with a lower power consumption of the apparatus than the second modulation scheme.

An apparatus is described. The apparatus may include an array of memory cells and a transmitter coupled with the array of memory cells and configured to transmit, across a transmission path between the array of memory cells and a bus, a first set of data symbols according to a first mode of operation of the apparatus, the first mode of operation including transmitting using a first modulation scheme having two logic levels. The transmitter may be further configured to transmit, across the transmission path between the array of memory cells and the bus, a second set of data symbols according to a second mode of operation of the apparatus. The apparatus may further include a controller coupled with the array of memory cells and the transmitter and configured to change, based on a value stored in the apparatus, from the first mode of operation of the apparatus to the second mode of operation of the apparatus including transmitting using a second modulation scheme having four logic levels, where transmitting the second set of data symbols according to the second mode of operation of the apparatus is based on the changing.

In some examples, the controller may be further configured to detect that the value stored in the apparatus by a mode register changes from a first value corresponding to the first mode of operation of the apparatus to a second value corresponding to the second mode of operation of the apparatus, where determining the change may be based on the detecting.

In some cases, transmitting using the first modulation scheme and transmitting using the second modulation scheme may include operations, features, means, or instructions for transmitting using a same data rate.

In some instances, transmitting using the first modulation scheme may include operations, features, means, or instructions for transmitting using a first data rate, and transmitting using the second modulation scheme may include operations, features, means, or instructions for transmitting using a second data rate faster than the first data rate.

In some examples, transmitting each data symbol within the first set of data symbols and the second set of data symbols may include operations, features, means, or instructions for transmitting more than one bit.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    programming, by a device, a mode register to store a value indicating a mode of operation based at least in part on one or more factors associated with an operation of the device, the mode of operation comprising a first mode associated with using a first modulation scheme having two logic levels or a second mode associated with using a second modulation scheme having four logic levels;

identifying, at the device, a data symbol comprising a first bit and a second bit for transmission;

selecting the mode of operation from the first mode or the second mode based at least in part on the value stored by the mode register; and transmitting the data symbol via a signal modulated by the first modulation scheme or the second modulation scheme based at least in part on the selected mode of operation.

2. The method of claim 1, further comprising:
determining that the mode register stores a first value indicating the first modulation scheme, wherein the selected mode of operation comprises the first modulation scheme based at least in part on the determining.

3. The method of claim 1, further comprising:
identifying a second data symbol comprising a first bit and a second bit for transmission;
selecting, from the first mode that comprises transmitting using the first modulation scheme and the second mode that comprises transmitting using the second modulation scheme, the second modulation scheme associated with the second mode for the transmission; and
transmitting the second data symbol via a second signal modulated by the second modulation scheme based at least in part on the selecting.

4. The method of claim 3, further comprising:
determining that the mode register stores a second value indicating the second modulation scheme, wherein selecting the second modulation scheme is based at least in part on the determining.

5. The method of claim 3, wherein:
the signal is modulated over one clock cycle at a first rate; and
the second signal is modulated over one clock cycle at a second rate faster than the first rate.

6. The method of claim 3, wherein:
the signal is modulated over two clock cycles at a rate; and
the second signal is modulated over one clock cycle at the rate.

7. The method of claim 1, wherein a value of the data symbol corresponds to one of the four logic levels of the second modulation scheme.

8. The method of claim 1, wherein a value of the first bit or the second bit corresponds to one of the two logic levels of the first modulation scheme.

9. The method of claim 1, wherein the first modulation scheme is associated with a lower power consumption of the device than the second modulation scheme.

10. An apparatus, comprising:
an array of memory cells;
a transmission path configured to couple the array of memory cells to a bus associated with the apparatus;
a mode register configured to store a value indicating that the apparatus is configured to transmit data symbols across the transmission path according to a first modulation scheme having two logic levels or a second modulation scheme having four logic levels; and
a controller coupled with the transmission path and the mode register, the controller configured to:
program the mode register to store the value indicating the first modulation scheme having the two logic levels and the second modulation scheme having the four logic levels based at least in part on one or more factors associated with an operation of the apparatus, and
select, based at least in part on the value stored by the mode register, between the first modulation scheme having the two logic levels for transmitting a signal and the second modulation scheme having the four logic levels for transmitting the signal.

11. The apparatus of claim 10, further comprising a transmitter coupled with the transmission path and the controller and configured to transmit, via the transmission path, the signal modulated by a modulation scheme selected from the first modulation scheme and the second modulation scheme.

12. The apparatus of claim 10, wherein the apparatus comprises a circuit coupled with the transmission path and configured to convert a signal from a parallel signal to a serial signal.

13. The apparatus of claim 10, wherein the apparatus comprises a circuit coupled with the transmission path and configured to convert a signal from a serial signal to a parallel signal.

14. An apparatus, comprising:
a controller configured to:
program a mode register to store a value indicating a mode of operation based at least in part on one or more factors associated with an operation of the apparatus, the mode of operation comprising a first mode associated with using a first modulation scheme having two logic levels or a second mode associated with using a second modulation scheme having four logic levels,
identify a data symbol comprising a first bit and a second bit for transmission, and
select the mode of operation from the first mode or the second mode based at least in part on the value stored by the mode register; and
a transmitter coupled with the controller and configured to transmit the data symbol via a signal modulated by the first modulation scheme or the second modulation scheme based at least in part on the selected mode of operation.

15. The apparatus of claim 14, further comprising the mode register configured to store a first value indicating the first modulation scheme, wherein the controller is further configured to determine that the mode register stores the first value and select the first modulation scheme as the selected mode of operation based at least in part on the determining.

16. The apparatus of claim 14, wherein:
the controller is further configured to:
identify a second data symbol comprising a first bit and a second bit for transmission, and
select, from the first mode that comprises transmitting using the first modulation scheme and the second mode that comprises transmitting using the second modulation scheme, the second modulation scheme for the transmission; and
the transmitter is further configured to transmit the second data symbol via a second signal modulated by the second modulation scheme based at least in part on the selecting.

17. The apparatus of claim 16, wherein the controller is further configured to determine that the mode register stores a second value indicating the second modulation scheme, wherein selecting the second modulation scheme is based at least in part on the determining.

18. The apparatus of claim 16, wherein:
the signal is modulated over one clock cycle at a first rate; and
the second signal is modulated over one clock cycle at a second rate faster than the first rate.

19. The apparatus of claim 16, wherein:
the signal is modulated over two clock cycles at a rate; and
the second signal is modulated over one clock cycle at the rate.

20. The apparatus of claim 14, wherein a value of the data symbol corresponds to one of the four logic levels of the second modulation scheme.

21. The apparatus of claim 14, wherein a value of the first bit or the second bit corresponds to one of the two logic levels of the first modulation scheme.

22. The apparatus of claim 14, wherein the first modulation scheme is associated with a lower power consumption of the apparatus than the second modulation scheme.

* * * * *